US010902914B2

(12) United States Patent
Dumitru et al.

(10) Patent No.: US 10,902,914 B2
(45) Date of Patent: Jan. 26, 2021

(54) PROGRAMMABLE RESISTIVE MEMORY ELEMENT AND A METHOD OF MAKING THE SAME

(71) Applicant: CYBERSWARM, INC., San Mateo, CA (US)

(72) Inventors: Viorel-Georgel Dumitru, Ploiesti (RO); Cristina Besleaga Stan, Bucharest (RO); Alin Velea, Bucharest (RO); Aurelian-Catalin Galca, Magurele (RO)

(73) Assignee: CYBERSWARM, INC., San Mateo, CA (US)

(*) Notice: Subject to any disclaimer, the term of this patent is extended or adjusted under 35 U.S.C. 154(b) by 0 days.

(21) Appl. No.: 16/431,290

(22) Filed: Jun. 4, 2019

(65) Prior Publication Data
US 2019/0378570 A1    Dec. 12, 2019

Related U.S. Application Data

(60) Provisional application No. 62/683,341, filed on Jun. 11, 2018.

(51) Int. Cl.
*G11C 11/00* (2006.01)
*G11C 13/00* (2006.01)
*G11C 11/56* (2006.01)

(52) U.S. Cl.
CPC ...... *G11C 13/0069* (2013.01); *G11C 11/5685* (2013.01); *G11C 13/004* (2013.01); *G11C 13/0007* (2013.01); *G11C 13/0038* (2013.01)

(58) Field of Classification Search
CPC . G11C 13/0069; G11C 13/004; G11C 13/003; G11C 2013/0078; H01L 21/8239;
(Continued)

(56) References Cited

U.S. PATENT DOCUMENTS 8,411,477 B2 *   4/2013   Tang ............... G11C 13/0007
                                                          257/390
9,112,145 B1 *   8/2015   Lu ..................... H01L 45/085
(Continued)

FOREIGN PATENT DOCUMENTS

WO   WO 2017/150617 A1   9/2017
WO   WO 2018/063308 A1   4/2018

OTHER PUBLICATIONS

European Search Report in EP Application No. 19178501.3 dated Nov. 21, 2019.

*Primary Examiner* — Hien N Nguyen
(74) *Attorney, Agent, or Firm* — DLA Piper LLP (US)

(57) ABSTRACT

A programmable resistive memory element and a method of adjusting a resistance of a programmable resistive memory element are provided. The programmable resistive memory element includes at least one resistive memory element. Each resistive memory element includes an Indium-Gallium-Zinc-Oxide (IGZO) resistive layer, a first electrical contact and a second electrical contact. The first and second electrical contacts are disposed on the IGZO resistive layer in the same plane. The programmable resistive memory element includes a voltage generator coupled to the first and second electrical contacts, constructed and arranged to apply a thermal treatment to the resistive memory element to adjust a resistance of the resistive memory element.

18 Claims, 2 Drawing Sheets

(58) Field of Classification Search
CPC ..... H01L 27/105; H01L 29/786; H01L 45/00; H01L 49/00
See application file for complete search history.

(56) References Cited

U.S. PATENT DOCUMENTS

| | | | |
|---|---|---|---|
| 2011/0157216 A1* | 6/2011 | Yamazaki | G09G 3/3648 345/596 |
| 2013/0272055 A1* | 10/2013 | Yamamoto | G11C 11/403 365/149 |
| 2019/0252020 A1 | 8/2019 | Rios et al. | |

* cited by examiner

PROGRAMMABLE RESISTIVE MEMORY ELEMENT AND A METHOD OF MAKING THE SAME

This application claims the benefit of U.S. Provisional Patent Application No. 62/683,341, filed Jun. 11, 2018, which is incorporated by reference in its entirety.

BACKGROUND

Programmable resistive memory elements can store information as different resistance states. For increasing memory density and data capacity, it is highly desirable to have a programmable memory with multiple resistance states. Programmable resistive memory elements with multiple resistance states can be used in many applications like nonvolatile solid state memories, programmable logic, pattern recognition, etc.

Indium-Gallium-Zinc-Oxide (IGZO) is widely used for realization of transparent thin films transistors (TFTs). IGZO based resistive memory elements may be easily integrated with TFTs and allow the realization of transparent memories arrays. Typically, an IGZO resistive memory element has a vertical structure, with an IGZO layer sandwiched in between bottom and top electrodes.

An IGZO resistive memory element is set in one or few low resistance states by applying a voltage pulse of 1-2 volts (V) and is reset (adjusted in a high resistance state) by applying a voltage pulse of opposite polarity. The set operation moves oxygen vacancies through the IGZO layer to form a conductive filament between top and bottom electrodes. The reset operation moves the oxygen vacancies so that the conductive filament is destroyed. However, the number of possible memory resistance states is limited.

SUMMARY

The present disclosure is directed toward a nonvolatile, programmable resistive memory element and a method to making the same. The programmable resistive memory element includes a substrate, an IGZO resistive layer and two electrical contacts (e.g., electrical electrodes). The element has a planar structure. The resistance of the resistive memory can be adjusted from an initial low value to various higher values by applying a local, on-chip thermal treatment in air atmosphere of the individual memory element. The thermal treatment is obtained by locally heating of the resistive memory element and is performed by applying one or more voltage sweeps to the resistive memory element. The high voltage limit during the sweeps may be set at values ranging from few volts to few tens of volts. In this manner, the number of storage states may be greatly increased. The reading of the memory is performed by measuring its resistance value with a low voltage pulse.

DETAILED DESCRIPTION OF THE DRAWINGS

DETAILED DESCRIPTION

As discussed herein, the present disclosure is directed to a programmable resistive memory element and a method of adjusting a resistance of a programmable resistive memory element. The programmable resistive memory element is nonvolatile and has multiple resistance states.

Figure 1:
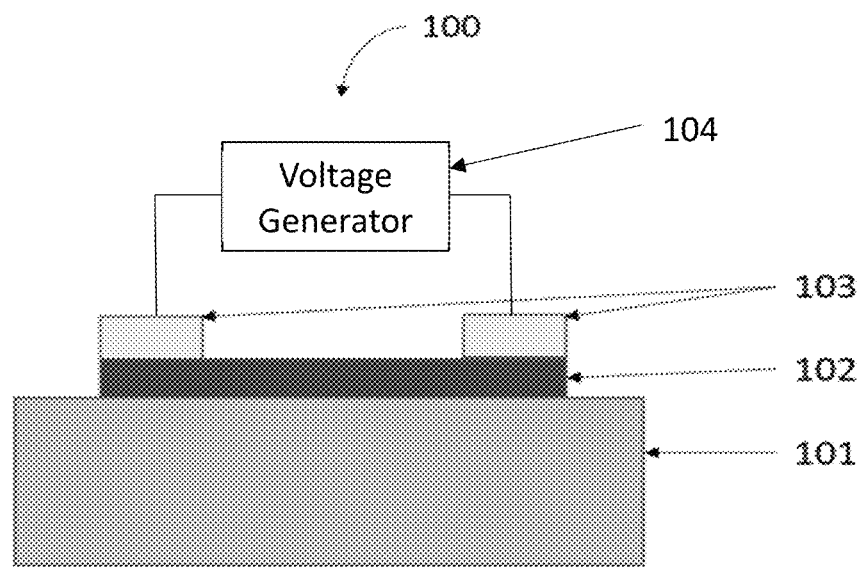
FIG. 1 illustrates a resistive memory structure in accordance with at least one example embodiment of the present disclosure.

FIG. 1 shows a cross-sectional view of a programmable resistive memory element 100 in accordance with at least one example embodiment. The programmable resistor memory element 100 can include a substrate 101, a resistive layer 102 and electrical contacts 103. The substrate 101 can be made of a dielectric material such as glass, high resistivity silicon, silicon carbide, sapphire, high temperature plastic foils, etc. The resistive layer 102 can be formed from an IGZO layer. The electrical contacts 103 can be made of Ti/Au, Al, Mo, indium tin oxide (ITO), aluminum zinc oxide (AZO), or any other metallization schema which is usually employed for the realization of electrical contacts of IGZO thin film transistors. By employing ITO or AZO transparent contacts, the programmable resistor memory element 100 can be made fully transparent to visible light.

Figure 2:
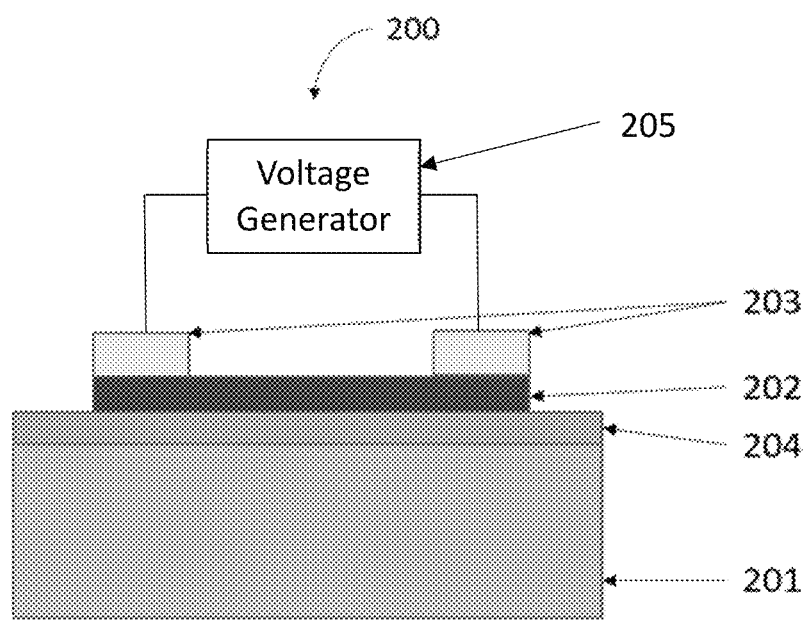
FIG. 2 illustrates a resistive memory structure in accordance with at least one example embodiment of the present disclosure.

FIG. 2 shows a cross-sectional view of a programmable resistive memory element 200 in accordance with at least one example embodiment. The programmable resistor memory element 200 can include a substrate 201, a resistive layer 202, electrical contacts 203 and a dielectric layer 204. The substrate 201 can be made of a material such as glass, metal, silicon, silicon carbide, sapphire, high temperature plastic foils, etc. The resistive layer 202 can be formed from an IGZO layer. The electrical contacts 203 can be made of Ti/Au, Al, Mo, ITO, AZO, or any other metallization schema which is usually employed for the realization of electrical contacts of IGZO thin film transistors. The dielectric layer 204 can be formed on the substrate 201 and made of a dielectric material such as $SiO_2$, $Al_2O_3$, AlN, etc. By employing ITO or AZO transparent contacts, the programmable resistor memory element 200 can be made fully transparent to visible light.

For the fabrication of the resistive memory structures presented in FIGS. 1 and 2, standard procedures employed for IGZO TFTs fabrication may be employed. The IGZO resistive layer may be deposited by sputtering in an Ar atmosphere. The electrical contacts may be realized by sputtering, electron-gun evaporation, thermal evaporation or any other deposition method usually used in the field.

Usually, in the IGZO TFTs realization process, especially in case of IGZO obtained by sputtering in Ar atmosphere, after the fabrication, the element is subjected to a high-temperature annealing step in air in order to increase the resistivity of the IGZO layer. During the high temperature annealing in air atmosphere, some of the oxygen vacancies present in the as-deposited film get passivated. As the oxygen vacancies act as electron donors, by reducing their concentration, the electron concentration is also reduced and thus the resistivity of the IGZO layer is increased.

For the realization of the IGZO programmable resistive memories, this high-temperature annealing step can be omitted. Instead, the as-deposited, high conductivity IGZO resistor layer, is subjected to a local on-chip thermal treatment in air atmosphere of the each individual memory element. The thermal treatment is obtained by locally heating of the resistive memory element which is performed by applying one or more voltage sweeps from voltage generator 104 in FIG. 1 or voltage generator 205 in FIG. 2.

An upper limit of the voltage sweep may be set accordingly with the desired resistance state for the individual resistor. During the voltage sweeps, the resistor gets heated and a certain amount of oxygen vacancies present in the film get passivated, thereby increasing the electrical resistance of the IGZO layer by a certain amount.

Figure 3:
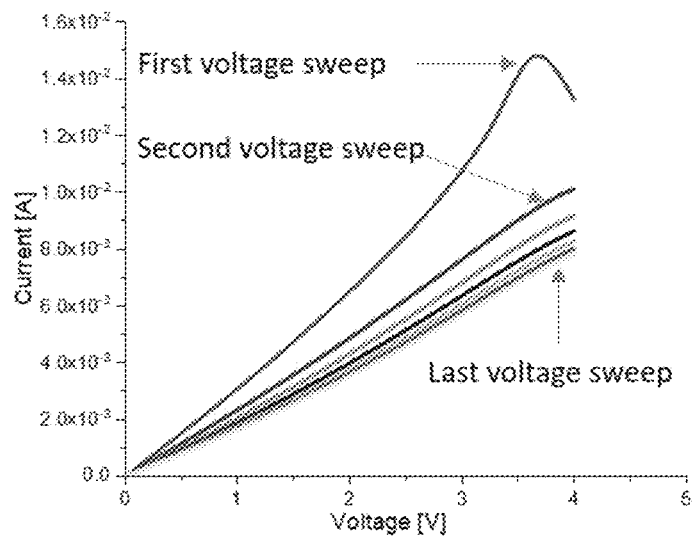
FIG. 3 illustrates current-voltage characteristics of a memory element with an on-chip treatment in accordance with at least one example embodiment of the present disclosure.

FIG. 3 shows current-voltage characteristics of a resistance memory element of a local on-chip treatment of an individual resistor, implemented by utilizing a voltage generator to apply subsequent DC voltage sweeps with the upper limit of the voltage sweeps set at 4 volts. During the voltage sweeps, the IGZO resistor layer gets heated and increases its resistance by a certain amount. For example, during each voltage sweep, the IGZO resistor layer gets heated by applying gradually increased voltage to a predetermined upper voltage limit. By setting the upper limit of the voltage sweeps and the number of sweeps cycles conducted with the respective upper voltage limit, different values of the resistance can be obtained for an individual resistor. The high voltage limit during the sweep cycles may be set at values ranging from a few volts to a few tens of volts. In this manner, the number of memory resistance states is greatly increased.

Figure 4:
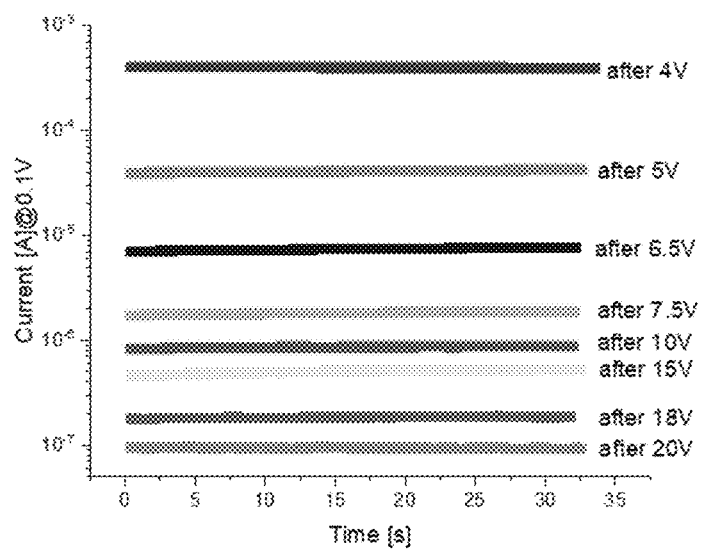
FIG. 4 illustrates a reading of multiple resistance states of a memory element in accordance with at least one example embodiment of the present disclosure.

FIG. 4 shows an example of reading multiple states of a resistance memory element by measuring the currents flowing through the memory element after setting the resistor in different resistance states by applying DC sweeps with various subsequent upper sweep limits ranged between 4 V and 20 V.

The reading of the resistance memory element is performed by measuring the current flowing through the IGZO layer when biased at a low voltage (e.g., 0.1 V) in order not to heat the IGZO layer.

As can be seen in FIG. 4, a great number of various resistance states can be obtained for a memory element by applying DC sweeps with different subsequent upper sweep limits.

Because the element resistance is adjusted from a low resistance state to a high resistance state by a local heating of the element which modifies the element resistance and makes the element resistance mostly irreversible, it is difficult to reset the element to a lower resistance state, especially for higher voltage settings. Thus, in such a case, the resistive memory element operates as a read-only type of programmable memory. The on-chip thermal treatment may adjust the resistive memory element from a lower resistance state to any of a plurality of higher resistance states.

The various embodiments described above are provided by way of illustration only and should not be construed to limit the scope of the disclosure. Various modifications and changes may be made to the principles described herein without following the example embodiments and applications illustrated and described herein, and without departing from the spirit and scope of the disclosure.

What is claimed is:

1. A programmable resistive element with multiple resistance states, comprising:
   an Indium-Gallium-Zinc-Oxide (IGZO) resistive layer;
   a first electrical contact and a second electrical contact disposed on the IGZO resistive layer in a same plane; and
   a voltage generator coupled to the first and second electrical contacts, constructed and arranged to apply a thermal treatment to the resistive memory element to adjust a resistance of the resistive memory element, wherein the thermal treatment is performed by applying one or more voltage sweeps to the IGZO resistive layer with an upper voltage limit.

2. The programmable resistive memory element of claim 1, wherein the upper voltage limit is set within a range between a few volts to a few tens of volts.

3. The programmable resistive memory element of claim 1, wherein an upper limit of the voltage sweep is set based on a desired resistance state for the IGZO resistor layer.

4. The programmable resistive memory element e of claim 1, wherein the resistive memory element operates as a read-only programmable memory after the element resistance is adjusted from a lower resistance state to one or more higher resistance states by applying the on-chip thermal treatment of the resistive memory element, thereby making its resistance irreversible.

5. The programmable resistive memory element of claim 3, wherein a current flowing through the IGZO layer biased with a low voltage is measured to read a resistance value associated with each of the plurality of higher resistance states of the resistive memory element.

6. The programmable resistive memory element of claim 1, wherein the first electrical contact and the second electrical contact are apart from each other.

7. The programmable resistive memory element of claim 1, wherein the first and second electrical contacts are made of at least one of Ti/Au, Al, Mo, indium tin oxide (ITO), aluminum zinc oxide (AZO), or any combination thereof.

8. The programmable resistive memory element of claim 1, further comprising a dielectric layer disposed between the IGZO layer and the substrate.

9. The programmable resistive memory element of claim 8, wherein the dielectric layer is made of at least one of $SiO_2$, $Al_2O_3$, AlN, or any combination thereof.

10. A method of adjusting a resistance of a programmable resistive memory element, including an Indium-Gallium-Zinc-Oxide (IGZO) resistive layer and a first electrical contact and a second electrical contact on the IGZO resistive layer in the same plane, the method comprising:
    applying an on-chip thermal treatment to the resistive memory element to adjust a resistance of the resistive memory element from a first resistance state to a second resistance state, the second resistive sate being higher than the first resistive state, wherein the thermal treatment is performed by applying one or more voltage sweeps to the IGZO resistive layer with an upper voltage limit.

11. The method of claim 10, further comprising setting the one or more voltage sweeps within a range between a few volts to a few tens of volts.

12. The method of claim 10, further comprising setting an upper limit of the voltage sweep based on a desired resistance state for the IGZO resistor layer.

13. The method of claim 10, wherein the on-chip thermal treatment adjusts the resistive memory element from a lower resistance state to any of a plurality of higher resistance states, thereby making the element resistance irreversible.

14. The method of claim 12, further comprising measuring a current flowing through the IGZO layer biased with a low voltage to read a resistance value associated with each of the plurality of higher states of the resistive memory element.

15. The method of claim 10, wherein the first electrical contact and the second electrical contact are apart from each other.

16. The method of claim 10, wherein the first and second electrical contacts are made of at least one of Ti/Au, Al, Mo, indium tin oxide (ITO), aluminum zinc oxide (AZO), or any combination thereof.

17. The method of claim 10, further comprising providing a dielectric layer disposed between the IGZO layer and the substrate.

18. The method of claim 17, wherein the dielectric layer is made of at least one of SiO2, Al2O3, AN, or any combination thereof.

* * * * *